United States Patent [19]
Uber

[11] Patent Number: 5,497,113
[45] Date of Patent: Mar. 5, 1996

[54] VARIABLE-SLOPE DRIVER FOR PULLUP-TERMINATED TRANSMISSION LINES

[75] Inventor: Richard Uber, Stow, Mass.

[73] Assignee: Quantum Corporation, Milpitas, Calif.

[21] Appl. No.: 242,769

[22] Filed: May 16, 1994

[51] Int. Cl.[6] .............................. H03K 5/12; H03K 5/08
[52] U.S. Cl. ......................... 327/170; 327/108; 327/310; 326/27
[58] Field of Search .................................. 326/82, 85, 89, 326/91, 25, 26, 58, 27, 21, 22, 103, 104; 327/175, 323, 322, 310, 312, 379, 170, 391, 108

[56] References Cited

U.S. PATENT DOCUMENTS

| | | | |
|---|---|---|---|
| 4,859,870 | 8/1989 | Wong et al. | 327/108 |
| 5,010,256 | 4/1991 | Dickie | 327/310 |
| 5,038,058 | 8/1991 | Wang | 326/31 |
| 5,105,102 | 4/1992 | Shioda | 326/103 |

Primary Examiner—Timothy P. Callahan
Assistant Examiner—Dinh T. Le
Attorney, Agent, or Firm—David B. Harrison; John C. Chen

[57] ABSTRACT

A transmission line driver circuit has active pullup and pulldown N-type field-effect transistors (N-FETs). An input stage employs a group of N-FETs and a group of P-type field-effect transistors (P-FETs) both being dimensioned and configured to yield a variable-slope switching characteristic for both high-to-low and low-to-high signal transitions. In the N-FET group, one N-FET has the same threshold voltage as the pulldown N-FET, is diode-connected, and is also connected in parallel with a substantially smaller N-FET. In the P-FET group, one P-FET is connected in parallel with a substantially smaller P-FET, and receives a buffered version of the output signal. Both the larger N-FET and larger P-FET conduct for only part of the respective signal transition during which they are active, so that each edge has two distinct slopes. The driver circuit also includes a differential amplifier connected in feedback configuration with the pullup N-FET to limit the maximum transmission line voltage.

15 Claims, 2 Drawing Sheets

VARIABLE-SLOPE DRIVER FOR PULLUP-TERMINATED TRANSMISSION LINES

BACKGROUND OF THE INVENTION

The invention is related to the field of digital data transmission lines and related driver circuits.

FIG. 1 depicts a commonly-used digital data transmission scheme. A transmission line 10 interconnects several communicating devices. The transmission line 10 has a characteristic impedance Z, typically on the order of a hundred ohms, and is terminated by a pullup resistor $R_t$ connected to a termination voltage $V_t$. Each communicating device employs a transmission line driver such as the illustrated driver circuit 12. A data input signal IN is applied to an inverter consisting of transistors Q1 and Q3, and the output of the inverter drives a pulldown transistor Q2. When the signal IN is LOW, transistor Q2 is ON, and it drives the signal OUT appearing on the transmission line 10 LOW. When the signal IN is HIGH, transistor Q2 is OFF. When the driver pulldown transistor of every device is OFF, the signal OUT is driven HIGH by the combination of resistor $R_t$ and termination voltage $V_t$.

The driver configuration shown in FIG. 1 is referred to as an "open-drain" driver. As noted, it operates to pull the signal OUT LOW only when it is turned ON. When it is OFF, it merely presents an impedance much greater than Z to the transmission line, so that OUT can be passively pulled high by the pullup termination. This common configuration is used for many reasons, one being the relative ease of attaining electrical compatibility between different devices connected to the transmission line. Each device merely has to present a sufficiently high impedance to the transmission line unless it desires to transmit a logic LOW. The Small Computer Systems Interconnect (SCSI) bus is one example of an open-drain, pullup-terminated transmission line.

One potential problem with any transmission line, including that of FIG. 1, is that of excessive electromagnetic radiation (EMR). EMR can induce noise in nearby electronic devices, and if severe can actually cause them to malfunction. Excessive EMR can be caused by an excessively fast switching rate, or slew rate, of the transmission line driver. As a general goal, then, it is desirable to minimize a driver's slew rate in order to minimize EMR. However, an excessively low slew rate disadvantageously increases the overall delay of the driver. Accordingly, it is desirable for a transmission line driver to operate with a slew rate that achieves a desired balance between speed and EMR.

Further complicating the design of transmission line drivers is the extent of normal variation in their operating characteristics. There are numerous factors that contribute to the slew rate of a driver, many of them being subject to considerable variation. Some of the more well-known factors affecting the operation of the driver are process, voltage, and temperature, as well as the impedance of the transmission line to which the driver is connected. A driver is typically designed to meet a maximum delay specification under worst-case process, voltage, temperature, and transmission-line-impedance conditions. Unfortunately, the same driver may have an intolerably fast switching rate, or slew rate, under best-case conditions, and for that reason contribute to excessive EMR. Conversely, drivers can readily be designed to have acceptable slew rates under all operating circumstances, but may then suffer from unacceptable delay under worst-case conditions.

SUMMARY OF THE INVENTION

In light of the foregoing problems and limitations in the prior art, it is an object of the invention to reduce the variabilities in the behavior of a driver circuit used to drive signals onto a variable-impedance transmission line having resistor pullup termination. In particular, it is an object to improve both the slew rate and delay characteristics of such drivers. Additionally, it is desired to achieve these objectives without adversely affecting either the power consumption of the driver or the noise immunity of the devices connected to the transmission line.

Accordingly, the invention has several aspects that address these objectives. In one aspect, the invention is a driver circuit having (1) a first N-type field-effect transistor (N-FET) having its conductive channel connected between ground and an output node OUT of the circuit to be coupled during operation to a transmission line having pullup termination; (2) a second N-FET having one source/drain connected to ground and having its gate and other source/drain connected together, the second N-FET having a threshold voltage substantially the same as that of the first N-FET; (3) a third N-FET substantially smaller than the second N-FET having one source/drain connected to ground, having its other source/drain connected to both the gate and the other source/drain of the second N-FET, and having its gate connected to an input node IN of the circuit; and (4) a fourth N-FET having its conductive channel connected between the gate of the first N-FET and the other source/drain of the second N-FET and having its gate connected to the node IN. The second N-FET conducts only during a portion of the high-to-low voltage transition of gate of the first N-FET, so that the signal slope decreases substantially as the second N-FET turns off.

A driver according to this first aspect of the invention has an improved rising edge slew rate on the transmission line without a significant increase in its overall delay. This advantage arises from the combination of a fast transition of the gate of the first N-FET outside the threshold region of the first N-FET and a slower transition in the neighborhood of the threshold region. Also, the ratio of the slopes can be chosen to accommodate any asymmetry of the threshold voltage about the midpoint of the gate voltage swing, so that overall delay is even further minimized.

In a second aspect, the invention is a driver circuit having (1) an N-type field-effect transistor (N-FET) having its conductive channel connected between ground and an output node OUT of the circuit to be coupled during operation to a transmission line having pullup termination; (2) a first P-type field-effect transistor (P-FET) having one source/drain connected to a positive supply node VDD and having its gate coupled to the node OUT; (3) a second P-FET substantially smaller than the first P-FET having one source/drain connected to the node VDD, having the other source drain connected to the other source/drain of the first P-FET, and having its gate connected to an input node IN of the circuit; and (4) a third P-FET having its conductive channel connected between the gate of said N-FET and said other source/drain of said first P-FET and having its gate connected to said node IN. The first P-FET is initially off, and then turns on when the signal OUT falls. Therefore the slope of the gate voltage of the N-FET starts relatively small and increases substantially as the first P-FET turns on.

It will be apparent that this second aspect has many of the advantages of the first aspect discussed above, albeit while achieving them in a slightly different manner.

In a final aspect, the invention is a driver circuit having (1) a pulldown transistor connected to an output node OUT of the circuit to be coupled during operation to a transmission line having a pullup terminator resistor connected to a source of a termination voltage; (2) a pullup transistor connected to the node OUT; (3) means for generating a reference voltage falling within a range between the termination voltage and a predetermined minimum voltage representing a logic high on the transmission line; and (4) a differential amplifier coupled to the generating means and to the pullup transistor in a manner effective to limit the maximum voltage on the node OUT to substantially the reference voltage.

This final aspect of the invention helps to improve the rising edge delay of the driver circuit through the use of an active pullup transistor that acts as a "booster". It also includes features that prevent the transmission line voltage from going beyond an acceptable maximum value. As a result, any undesirable DC current flowing through the active pullup transistor and the pullup terminator is minimized, and falling edge delay is not adversely affected as it would if the maximum transmission line voltage were allowed to increase.

All these and other aspects and advantages of the invention will be apparent from the following detailed description.

BRIEF DESCRIPTION OF THE DRAWINGS

An embodiment of the invention will be described with reference to the accompanying drawings, in which.

DETAILED DESCRIPTION

Figure 1:
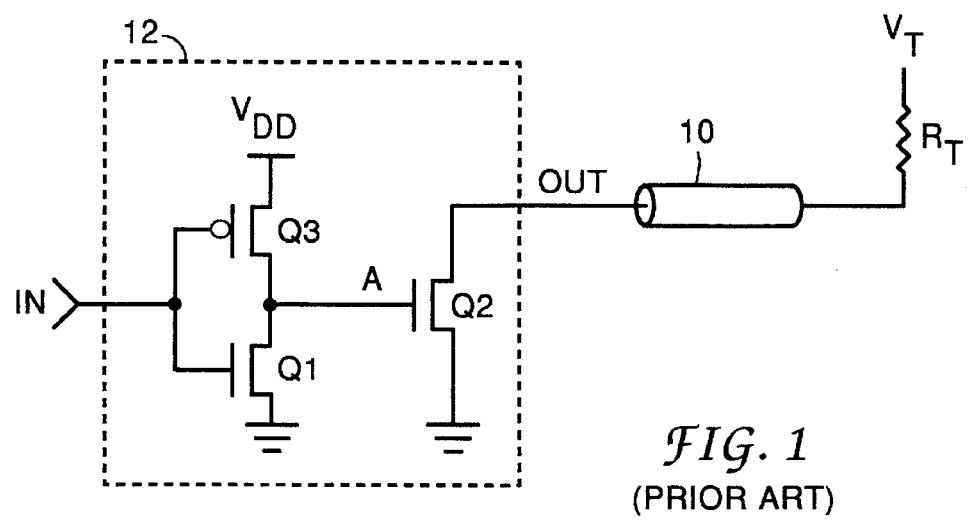
FIG. 1 is a schematic diagram of a prior art transmission line driver circuit.
Figure 2:
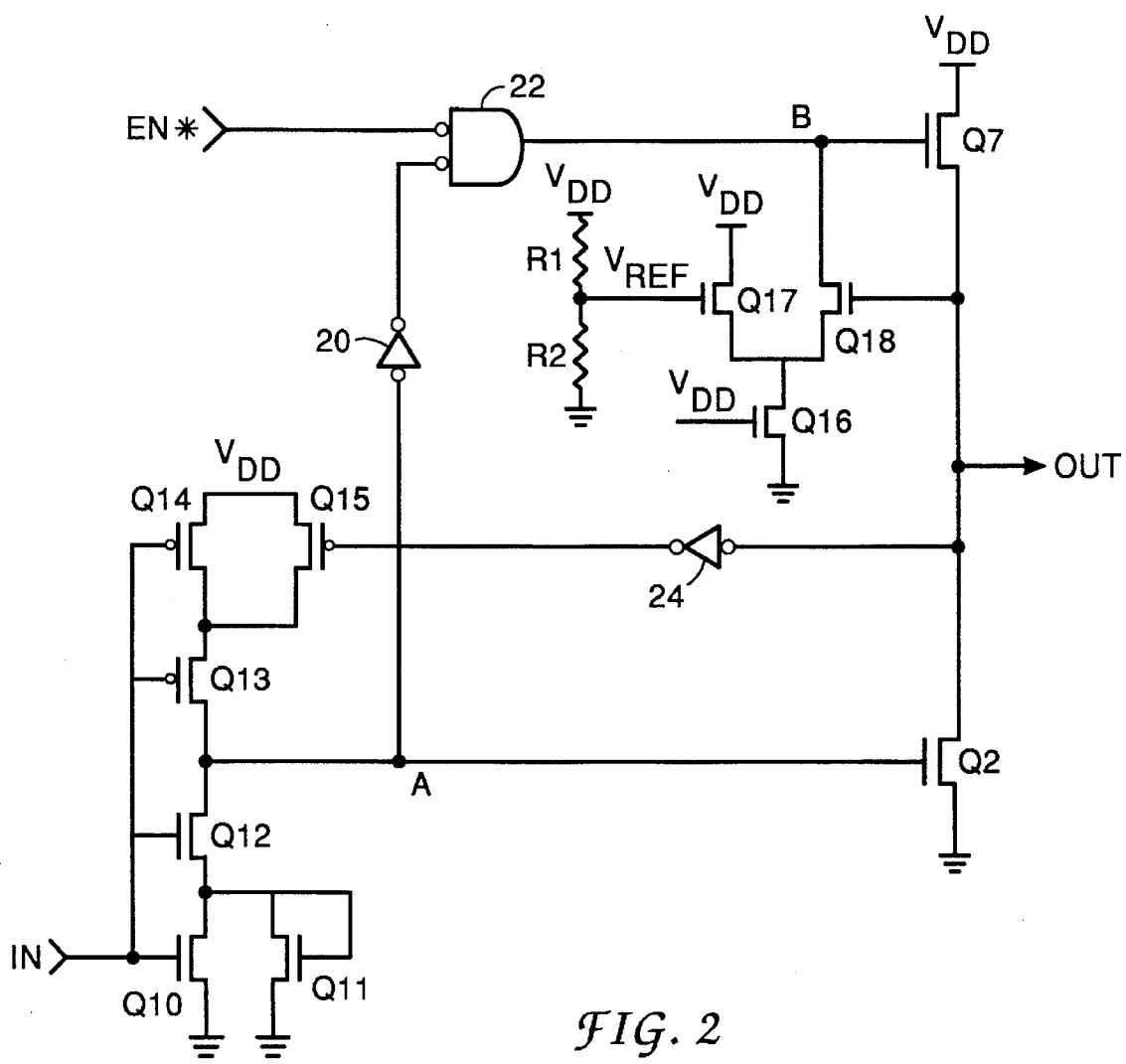
FIG. 2 is a schematic diagram of a transmission line driver circuit in accordance with the principles of the present invention.

Referring to the embodiment of the invention shown in FIG. 2, an N-type field-effect transistor (N-FET) Q2 serves as an active pulldown for the transmission line, while an N-FET active pullup Q7 is also included. Both Q2 and Q7 are connected to a circuit node OUT that is to be coupled to a transmission line such as the transmission line 10 of FIG. 1. The signal A appearing on the gate of Q2 is also routed through a buffer 20 and a NOR gate 22 to the gate of Q7, which is labelled B. The other input to the NOR gate 22 is a signal EN*, generated by logic not shown in FIG. 2.

The inverter consisting of transistors Q1 and Q3 in FIG. 1 is replaced in FIG. 2 by N-FETs Q10–Q12 and P-type field-effect transistors (P-FETs) Q13–Q15. As shown, N-FET Q11 is connected in parallel with N-FET Q10, and has its gate and drain connected together. N-FET Q11 is designed to have a threshold voltage matching that of N-FET Q2 as closely as possible, for reasons explained below. Also, N-FETs Q11 and Q12 are preferably substantially the same size, and substantially larger than Q10. A preferred ratio of the size of Q11 to that of Q10 is 7:1.

P-FET Q15 is connected in parallel with P-FET Q14. The gate of P-FET Q15 receives a version of the output signal OUT that is buffered by a buffer 24. P-FETS Q15 and Q13 are preferably substantially the same size, and substantially larger than P-FET Q14, approximately four times larger. A preferred ratio of the size of Q15 to that of Q14 is about 3.5:1.

The driver circuit of FIG. 2 contains an N-FET pullup Q7 that acts in conjunction with the pullup termination $R_T$ to pull the signal OUT high. Q7 helps to solve a problem peculiar to a pullup-terminated transmission line, e.g. line 10 of FIG. 1. If the ratio of the pullup resistance $R_t$ to the transmission line impedance Z is too high, then a low-to-high signal transition may have to make multiple trips on the transmission line before a minimum logic high level is reached at all points on the cable. This of course would result in a greatly increased rising edge delay. The pullup device Q7 overcomes this problem by acting as a "booster" to supplement the line-charging current provided by the terminator. Unfortunately, the addition of Q7 also makes it possible that the voltage of OUT will increase beyond the termination voltage $V_t$. If that were to happen, two deleterious side effects would result: (1) Undesirable DC current would flow through the pullup device Q7 and the terminator resistor $R_t$, and (2) falling edge delay would be increased.

Because of these potential problems, the driver circuit of FIG. 2 contains circuitry that functions to limit the maximum voltage of OUT. This circuitry consists of N-FETs Q16–Q18 and resistors R1 and R2. Resistors R1 and R2 form a basic voltage divider used to generate a reference voltage $V_{ref}$. In the illustrated embodiment, the values of R1 and R2 are 20K ohms and 17K ohms, respectively. These values establish $V_{ref}$ at approximately 2.3 volts when VDD is 5 volts. This value of $V_{ref}$ is appropriate for a termination voltage $V_t$ in the range of 2.6–2.9 volts, a range commonly employed on a SCSI transmission line. N-FETS Q16–Q18 form a differential amplifier, with N-FET Q16 serving as a constant current source for the differential pair consisting of N-FETs Q17 and Q18. It will be noted that the drain of Q17 is connected to VDD, while that of Q18 is connected to node B, the gate input of the pullup N-FET Q7.

Figure 3:
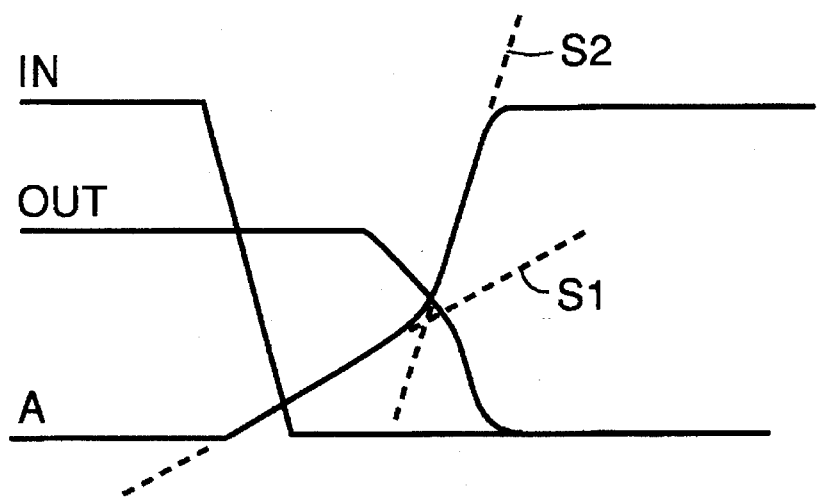
FIG. 3 is a waveform diagram showing the behavior of various signals in the circuit of FIG. 2 during a high-to-low transition.
Figure 4:
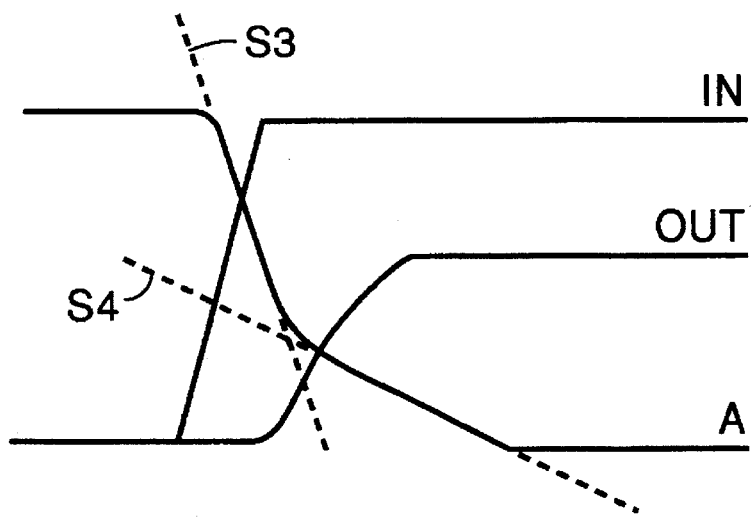
FIG. 4 is a waveform diagram showing the behavior of various signals in the circuit of FIG. 2 during a low-to-high transition.

Now that the structure of the circuit of FIG. 2 has been described, its operation will be described with reference to FIGS. 3 and 4. Assume, as depicted in FIG. 3, that the signals IN and OUT are initially at logic HIGH values, and that signal A is LOW. As the signal IN falls, N-FET Q12 turns off, and P-FETS Q13 and Q14 turn on. P-FET Q15 initially remains off because the signal OUT has not yet begun falling. Signal A starts to rise. However, because PFET Q15 is initially off and P-FET Q14 is relatively small, the slope of A's rise is initially low. This is illustrated in FIG. 3 as initial slope S1.

As A passes the threshold of pulldown N-FET Q2, the signal OUT starts to fall. Because the initial slope S1 of A is relatively low, the edge rate of OUT is not excessively fast. When OUT has fallen sufficiently, the buffer 24 switches, and P-FET Q15 turns on. The conduction of P-FET Q15 in turn substantially increases the rate at which signal A switches. This is illustrated in FIG. 3 as final slope S2. With the signal A rising more quickly, node OUT finishes its transition more quickly, so that overall delay is minimized.

The low-to-high transition is analogous to the high-to-low transition just described. The low-to-high transition is described as follows with reference to FIG. 4. The signals IN and OUT are initially low, and A is high. As IN rises, P-FET Q13 turns off, and N-FETS Q10–Q12 turn on. As a result, node A initially falls rapidly, as indicated in FIG. 4 by initial slope S3. This fast initial slope S3 is responsible for minimizing the low-to-high switching delay on node OUT.

As A falls, so does the gate voltage on N-FET Q11; accordingly, Q11 conducts a decreasing amount of current. It will be recalled that the threshold of N-FET Q11 equals that of the pulldown N-FET Q2. Accordingly, as A approaches the threshold voltage of Q2, both N-FETs Q2 and Q11 start turning off. As Q2 turns off, the signal OUT starts to rise. As Q11 turns off, only N-FETs Q10 and Q12 remain on for the rest of the transition. Because N-FET Q10 is much smaller than Q11, the slope of A decreases substantially. This is indicated in FIG. 4 by final slope S4. A's lower slope S4 in the region of the threshold of Q2 keeps the edge rate of OUT to an acceptable value during the remainder of the low-to-high transition.

It will be noted that as signal A rises, its slope increases from S1 to S2, whereas its slope decreases from S3 to S4 when it falls. Another way of viewing this is that both the rising and falling slopes are greater when A's voltage is above the threshold of the pulldown N-FET Q2. This characteristic is desirable in embodiments such as those of FIG. 2, where the threshold of the pulldown Q2 is significantly less than VDD/2, because the greater slope compensates for the greater voltage swing required of A above threshold. In alternative embodiments it may be unnecessary to arrange the slopes S1–S4 this way, or it may be advantageous to arrange them differently. Such changes can be made by changing the sizes of the various transistors in a manner that is known in the art.

It should also be noted that the input to the buffer 24, namely the signal OUT, is not a full-rail logic signal. Accordingly, the threshold of buffer 24 should be set lower than the conventional threshold of VDD/2. The preferred threshold is approximately the logic HIGH level for receivers on the bus 10.

As is apparent from the foregoing, the circuit of FIG. 2 attains a desirable variable-slope characteristic during both logical transitions. While such a result is indeed desirable, it may be advantageous in alternative embodiments to exploit the variable-slope property for only one transition, and to have a more conventional single-slope signal characteristic on the other transition. This may be accomplished, for example, by retaining Q1 or Q3 of FIG. 1, as appropriate, in the circuit of FIG. 2 rather than replacing it with its variable-slope equivalent. Alternative embodiments may achieve such operation in other ways that will be apparent to those skilled in the art.

The voltage-limiting function of P-FETs Q16–Q18 and resistors R1 and R2 will now be described. The voltage $V_{ref}$ is ideally set to a value between the terminator voltage $V_t$ and the minimum voltage accepted as a logic HIGH by all the devices on the transmission line 10. This minimum value is about 2.0 volts on a SCSI bus, but of course may vary in alternative embodiments. Setting $V_{ref}$ in this manner ensures the correct operation of the system while minimizing unnecessary DC current flow through Q7 and the terminator resistor $R_t$.

During a low-to-high transition, node B is driven high when node A switches low and the signal EN* is asserted. As A switches low, pulldown Q2 turns off, and OUT starts to rise due to the pullup termination on the transmission line. Also, the pullup N-FET Q7 turns on and helps to pull OUT high. As OUT approaches $V_{ref}$, N-FET Q18 turns ON. The current conducted by Q18 counteracts the output of NOR gate 22, and thus limits the rise of node B. As a result, Q7 turns off. The circuit finally reaches a steady state wherein the voltage of OUT is substantially equal to $V_t$. As noted, this limiting of the voltage of OUT prevents the pullup N-FET Q7 from sourcing significant current into the terminator supply $V_t$.

It should be noted that Q18 must be large enough to over-drive the output of the NOR gate 22. Also, the delay through buffer 20 and NOR gate 22 should be high enough to allow the cable pullup termination to act before the pullup N-FET Q7 does. Under such circumstances, the overall rising-edge delay of the driver is set primarily by the pullup termination, as is desired, while the pullup N-FET Q7 acts as a booster in accordance with the principles of the invention. If the delay through buffer 20 and NOR gate 22 is insufficient, then Q7 will determine the rising slew rate. This is undesirable because of the increased possibility of increased slew rate problems as mentioned above.

During a high-to-low transition, it will be appreciated that the voltage limiting circuit plays substantially no role. As A rises, the NOR gate 22 drives node B low, so that the pullup Q7 is turned off. This allows the pulldown Q2 to drive the signal OUT low. It is noteworthy that the NOR gate 22 has a natural asymmetry in its delay characteristics that is advantageously exploited in the illustrated embodiment. As noted, sufficient rising delay is necessary to allow the terminator to act before Q7 during the low-to-high transition. In contrast, it is desirable for node B to be pulled low quickly during the high-to-low transition, so that the pulldown Q2 does not fight against the pullup Q7. The NOR gate 22 naturally has a larger rising edge delay than falling edge delay, and thus is ideally suited for such operational requirements.

As noted above, the signal EN* enables or disables the operation of the pullup Q7 based on its value. This signal is used for two purposes. First, it may be used to completely disable Q7, so that only the pullup termination on the bus acts to pull the signal OUT high. This configuration may be desirable if the implementation has relaxed delay requirements. One example may be found in the SCSI specification, which allows for both a "slow" operational mode in which the bus cycle time is 200 ns, and also a "fast" mode in which it is 100 ns. The signal EN* can be used to enable Q7 in fast mode and disable it in slow mode.

Another function of the signal EN* is to prevent Q7 from acting when the device containing it is not driving the bus. Under such circumstances, the signal IN will normally be left high. Without some disabling means, this value of IN would result in turning Q7 on, which would result in possible conflict with whatever device is using the bus. The signal EN*, therefore, is deasserted during such times to prevent such a conflict. The specific logic used to implement this functionality for the signal EN* is not germane to the present invention, and suitable implementations will be readily apparent to those skilled in the art.

It will be noted that the circuit of FIG. 2 employs an N-FET pullup Q7 rather than a more conventional P-FET. The illustrated configuration satisfies a requirement of the SCSI bus that a device present a high impedance to the bus when it is powered off. A P-FET generally contains a parasitic PN junction between its source/drain and VDD, while an N-FET does not. As a result, N-FETs exhibit much higher output impedance when powered off than do P-FETs. In alternative embodiments wherein the diode to VDD of a P-FET can be tolerated, it may be advantageous to use a P-FET pullup. In such a case, the differential amplifier embodied by N-FETs Q16–Q18 would instead employ P-FETs, and the P-FET equivalent of Q16 would be tied to VDD rather than ground. Also, the signal B would be inverted.

While in the illustrated embodiment $V_{ref}$ is generated by a simple voltage divider consisting of resistors R1 and R2, it may also be generated in any of a variety of alternative known ways. In particular, it may be advantageous to generate $V_{ref}$ in a manner that is insensitive to variations in process and power supply, such as by using a band-gap-based reference. The illustrated divider of course has the advantage of simplicity. It is to be understood that the precise implementation of the $V_{ref}$ generator is not critical to achieving the objects of the invention.

What is claimed is:

1. A transmission line driver circuit, comprising:

a first N-type field-effect transistor (N-FET) having a conductive channel including a source connected to ground and a drain connected to an output node (OUT) of said circuit coupled during circuit operation to a transmission line having a pull termination to a positive termination voltage supply (Vt) relative to ground;

a second N-FET having a source connected to ground and having a gate and drain connected together, said second N-FET having a threshold voltage substantially the same as a threshold voltage of said first N-FET;

a third N-FET substantially smaller than said second N-FET and having a source connected to ground, having a drain connected to both the gate and drain of said second N-FET, and having a gate connected to an input node (IN) of said circuit; and a fourth N-FET having a conductive channel connected between the gate of said first N-FET and said drain of said second N-FET and having a gate connected to said input node (IN)

such that during a logical LOW to HIGH transition at the input node (IN), a transition slope from logical LOW to HIGH at the output node (OUT) is steep until the threshold voltage of the first N-FET is reached and thereafter is less steep, as determined by a ratio of size between the third N-FET and the second N-FET.

2. A circuit according to claim 1, wherein said third N-FET is approximately 7 times smaller than said second N-FET.

3. A circuit according to claim 1, wherein said fourth N-FET is substantially the same size as said second N-FET.

4. A transmission line driver circuit, comprising:

a first N-Type filed-effect transistor (N-FET) having its conductive channel including a source connected ground and a drain connected to an output node (OUT) of said circuit coupled during circuit operation to a transmission line having a pullup termination to a positive termination supply (Vt) relative to ground;

a first P-type field-effect transistor (P-FET) having a source connected to a positive supply node (VDD), having a drain and having a gate coupled to said output node (OUT) through a buffer having a buffer voltage threshold;

a second P-FET substantially smaller than said first P-FET and having a source connected to said node (VDD), having a drain connected to said drain of said first P-FET, and having a gate connected to an input node (IN) of said circuit; and a third P-FET having its conductive channel connected between the gate of said first N-FET and said drain of said first P-FET and having its gate connected to said input node (IN), such that during a logical HIGH to LOW transition at the input node (IN), a transition slope from logical HIGH to LOW at the output node (OUT) is less steep as determined by a ratio of size between the smaller second P-FET and the first P-FET until the buffer voltage threshold is reached whereupon the first P-FET conducts and increases a slope of a control voltage at the grate of the first N-FET causing a more steep transition slope from logical HIGH to LOW at the output node (OUT).

5. A circuit according to claim 4, wherein said second P-FET is approximately 3.5 times smaller than said first P-FET.

6. A circuit according to claim 4, wherein said third P-FET is substantially the same size as said first P-FET.

7. A transmission line driver circuit, comprising:

a first N-type field-effect transistor (N-FET) having a conductive channel including a source connected to ground and a drain connected to an output node (OUT) of said circuit coupled during circuit operation to a transmission line having a pullup termination to a positive termination voltage supply (Vt) relative to ground;

a second N-FET having a source connected to ground and having a gate and drain connected together, said second N-FET having a threshold voltage substantially the same as a threshold voltage of said first N-FET;

a third N-FET substantially smaller than said second N-FET and having a source connected to ground, having a drain connected to both the gate and drain of said second N-FET, and having a gate connected to an input node (IN) of said circuit;

a fourth N-FET substantially the same size as said second N-FET and having a conductive channel connected between the gate of said first N-FET and said drain of said second N-FET and having a gate connected to said input node (IN), a first P-type field-effect transistor (P-FET) having a source connected to a positive supply node (VDD), having a drain and having a gate coupled to said output node (OUT) through a buffer having a buffer voltage threshold;

a second P-FET substantially smaller than said first P-FET and having a source connected to said (VDD), having a drain connected to said drain of said first P-FET, and having a gate connected to an input node (IN) of said circuit; and a third P-FET having its conductive channel connected between the gate of said first N-FET and said drain of said first P-FET and having its gate connected to said input node (IN), such that during a logical LOW to HIGH transistion at the input node (IN), a transition slope from logical LOW to HIGH at the output node (OUT) is steep until the threshold voltage of the first N-FET is reached and thereafter is less steep, as determined by a ratio of size between the smaller third N-FET and the second N-FET; and, such that during a logical HIGH to LOW transition at the input node (IN), a transition slope from logical HIGH to LOW at the output node (OUT) is less steep as determined by a ratio of size between the smaller second P-FET and the first P-FET until the buffer voltage threshold is reached whereupon the first P-FET conducts and increases a slope of a control voltage at the gate of the first N-FET causing a more steep transition slope from logical HIGH to LOW at the output node (OUT).

8. A transmission line driver circuit for driving an output signal onto a transmission line connected through a termination resistance to a termination positive voltage supply (Vt) comprising:

a first n-channel field-effect transistor (N-FET) (Q2) having its conductive channel connected between ground and an output node (OUT) of said circuit which is connected to said transmission line and having its gate connected to a circuit node (A);

a second N-FET (Q7) having its conductive channel connected between said output node (OUT) and a positive supply node (VDD) and having its gate connected to a circuit node (B);

a third N-FET (Q12) having a drain connected to said node (A) and having its gate connected to an input node (IN) of said circuit;

a fourth N-FET (Q11) having its gate and drain connected to the source of said third N-FET (Q12) and having a source connected to ground, said fourth N-FET (Q11) being substantially the same size as said third N-FET (Q12) and having a threshold voltage substantially the same as that of said first N-FET (Q2);

a fifth N-FET (Q10) having its conductive channel connected between said source of said third N-FET (Q12) and ground and having its gate connected to said input node (IN), said fifth N-FET (Q10) being substantially smaller than said third and fourth N-FETs (Q11 and Q12);

a first P-type field-effect transistor (P-FET) (Q13) having a source connected to said node (A) and having its gate connected to said input node (IN);

a second P-FET (Q15) having its conductive channel connected between a drain of said first P-FET (Q13) and said node (VDD), said second P-FET (Q15) being substantially the same size as said first P-FET (Q13);

a third P-FET (Q14) having its conductive channel connected between said drain of said first P-FET (Q13) and said node (VDD) and having its gate connected to said input node (IN), said third P-FET (Q14) being substantially smaller than said first and second P-FETs (Q13 and Q15);

a first buffer (24) having an input connected to said output node (OUT) and having an output connected to the gate of said second P-FET (Q15);

an inverting logic gate (22) having a first input and having an output connected to said node (B);

a second buffer (20) having an input connected to said node (A) and an output connected to said first input of said inverting logic gate (22);

a sixth N-FET (Q18) having a drain connected to said node B and having its gate connected to said output node (OUT);

a seventh N-FET (Q17) having a drain connected to said node (VDD), having a source connected to the source of said sixth N-FET (Q18), and having a gate connected to a reference voltage node (REF) to which a reference-voltage-generating circuit is connected; and an eighth N-FET (Q16) having its conductive channel connected between said source of said sixth N-FET (Q18) and ground and having its gate connected to said node (VDD).

9. A circuit according to claim 1 further comprising:

a pullup transistor connected between said output node (OUT) and a positive supply node (VDD), said pullup transistor being a fifth N-FET;

reference voltage providing means for providing a reference voltage within a range between said termination voltage and a predetermined minimum voltage representing a logical HIGH at said output node (OUT); and a differential amplifier having one input coupled to said reference voltage providing means and having another input coupled said output node (OUT) and having an output connected to a control gate of said pullup transistor, said differential amplifier for substantially turning off said pullup transistor when a feedback signal from said output node (OUT) exceeds said reference voltage.

10. A circuit according to claim 9, further comprising a logic gate having a first input connected to the gate of the first N-FET, a second input connected to an enable signal, and an output connected to said pullup transistor and upon which appears a logic signal of said predetermined minimum voltage to operate said pullup transistor when said enable signal is enabled and when said input node (IN) switches to a logical HIGH, and wherein said differential amplifier is coupled to the output of said logic gate and overdrives said logic signal toward to limit the voltage at the output node (OUT) to not exceed the termination voltage (VT) as the voltage on said transmission line approaches said reference voltage.

11. A circuit according to claim 9 wherein said differential amplifier comprises:

a sixth N-FET having a drain connected to a positive supply node (VDD) and a gate connected to said reference voltage providing means;

a seventh N-FET having a drain connected to a gate of said pullup transistor, a source connected to a source of said sixth N-FET, and a gate connected to said output node (OUT); and a constant current source having a current output connected to said source of said sixth N-FET.

12. A circuit according to claim 11, wherein said constant current source comprises an N-FET having its conductive channel connected between said source of said sixth N-FET and ground and having its gate coupled to said node (VDD).

13. A circuit according to claim 9, wherein said reference voltage generating means comprises a resistive voltage divider network connected between a positive supply node (VDD) and ground.

14. A circuit according to claim 10, wherein said logic gate is a NOR gate.

15. A circuit according to claim 8, wherein said inverting logic gate is a two-input NOR gate having a second input connected to an enable node (EN*) of said circuit.

* * * * *